United States Patent
Hsu et al.

(10) Patent No.: US 8,963,316 B2
(45) Date of Patent: Feb. 24, 2015

(54) SEMICONDUCTOR DEVICE AND METHOD FOR MANUFACTURING THE SAME

(75) Inventors: Chih-Jing Hsu, Kaohsiung (TW);
Ying-Te Ou, Kaohsiung (TW);
Chieh-Chen Fu, Kaohsiung (TW);
Che-Hau Huang, Kaohsiung (TW)

(73) Assignee: Advanced Semiconductor Engineering, Inc. (TW)

( * ) Notice: Subject to any disclaimer, the term of this patent is extended or adjusted under 35 U.S.C. 154(b) by 346 days.

(21) Appl. No.: 13/397,169

(22) Filed: Feb. 15, 2012

(65) Prior Publication Data

US 2013/0207260 A1    Aug. 15, 2013

(51) Int. Cl.
*H01L 23/48* (2006.01)
*H01L 21/768* (2006.01)

(52) U.S. Cl.
CPC ............ *H01L 21/768* (2013.01); *H01L 23/481* (2013.01)
USPC ............ 257/692; 257/698; 257/737; 768/612

(58) Field of Classification Search
CPC ............................ H01L 21/768; H01L 23/481
USPC ............................ 257/692, 698, 737; 438/612
See application file for complete search history.

(56) References Cited

U.S. PATENT DOCUMENTS

| | | |
|---|---|---|
| 3,761,782 A | 9/1973 | Youmans |
| 4,394,712 A | 7/1983 | Anthony |
| 4,499,655 A | 2/1985 | Anthony |
| 4,807,021 A | 2/1989 | Okumura |
| 4,842,699 A | 6/1989 | Hua et al. |
| 4,897,708 A | 1/1990 | Clements |
| 4,982,265 A | 1/1991 | Watanabe et al. |
| 5,166,097 A | 11/1992 | Tanielian |
| 5,191,405 A | 3/1993 | Tomita et al. |
| 5,229,647 A | 7/1993 | Gnadinger |
| 5,239,448 A | 8/1993 | Perkins et al. |
| 5,308,443 A | 5/1994 | Sugihara |
| 5,404,044 A | 4/1995 | Booth et al. |
| 5,615,477 A | 4/1997 | Sweitzer |
| 5,643,831 A | 7/1997 | Ochiai et al. |
| 5,998,292 A | 12/1999 | Black et al. |
| 6,276,599 B1 | 8/2001 | Ogawa |
| 6,329,631 B1 | 12/2001 | Yueh |
| 6,406,934 B1 | 6/2002 | Glenn et al. |
| 6,448,506 B1 | 9/2002 | Glenn et al. |
| 6,457,633 B1 | 10/2002 | Takashima et al. |
| 6,577,013 B1 | 6/2003 | Glenn et al. |
| 6,610,934 B2 | 8/2003 | Yamaguchi et al. |

(Continued)

FOREIGN PATENT DOCUMENTS

| | | |
|---|---|---|
| JP | 2002246540 A | 8/2002 |
| JP | 2004228135 A | 8/2004 |
| TW | 200612539 A | 4/2006 |

*Primary Examiner* — Nicholas Tobergte
(74) *Attorney, Agent, or Firm* — Morgan Law Offices, PLC

(57) ABSTRACT

The present invention relates to a semiconductor device and a method for making the same. The semiconductor device includes a substrate, a first redistribution layer and a conductive via. The substrate has a substrate body and a pad. The pad and the first redistribution layer are disposed adjacent to the first surface of the substrate body, and electrically connected to each other. The interconnection metal is disposed in a through hole of the substrate body, and contacts the first redistribution layer. Whereby, the pad can be electrically connected to the second surface of the substrate body through the first redistribution layer and the conductive via.

16 Claims, 10 Drawing Sheets

(56) References Cited

U.S. PATENT DOCUMENTS

| | | |
|---|---|---|
| 6,670,269 B2 | 12/2003 | Mashino |
| 6,699,787 B2 | 3/2004 | Mashino |
| 6,740,950 B2 | 5/2004 | Paek |
| 6,812,549 B2 | 11/2004 | Umetsu et al. |
| 6,815,348 B2 | 11/2004 | Mashino |
| 6,962,829 B2 | 11/2005 | Glenn et al. |
| 7,078,269 B2 | 7/2006 | Yamasaki et al. |
| 7,098,117 B2 | 8/2006 | Najafi et al. |
| 7,134,198 B2 | 11/2006 | Nakatani |
| 7,157,372 B1 | 1/2007 | Trezza |
| 7,204,737 B2 | 4/2007 | Ding et al. |
| 7,215,032 B2 | 5/2007 | Trezza |
| 7,222,420 B2 | 5/2007 | Moriizumi |
| 7,238,590 B2 | 7/2007 | Yang et al. |
| 7,262,475 B2 | 8/2007 | Kwon et al. |
| 7,274,101 B2 | 9/2007 | Tomita et al. |
| 7,276,787 B2 | 10/2007 | Edelstein et al. |
| 7,285,434 B2 | 10/2007 | Yee et al. |
| 7,298,030 B2 | 11/2007 | McWilliams et al. |
| 7,334,326 B1 | 2/2008 | Huemoeller et al. |
| 7,358,174 B2 * | 4/2008 | Mis ............... 438/612 |
| 7,365,436 B2 | 4/2008 | Yamano |
| 7,371,602 B2 | 5/2008 | Yee |
| 7,388,293 B2 | 6/2008 | Fukase et al. |
| 7,415,762 B2 | 8/2008 | Fukase et al. |
| 7,446,424 B2 | 11/2008 | Lu et al. |
| 7,476,567 B2 | 1/2009 | Sato |
| 7,482,272 B2 | 1/2009 | Trezza |
| 7,508,057 B2 | 3/2009 | Shiraishi et al. |
| 7,508,079 B2 | 3/2009 | Higashi |
| 7,528,053 B2 | 5/2009 | Huang et al. |
| 7,538,033 B2 | 5/2009 | Trezza |
| 7,553,752 B2 | 6/2009 | Kuan et al. |
| 7,560,744 B2 | 7/2009 | Hsiao et al. |
| 7,589,394 B2 | 9/2009 | Kawano |
| 7,598,163 B2 | 10/2009 | Callahan et al. |
| 7,605,463 B2 | 10/2009 | Sunohara et al. |
| 7,608,534 B2 | 10/2009 | Yun et al. |
| 7,625,818 B2 | 12/2009 | Wang |
| 7,642,132 B2 | 1/2010 | Huang et al. |
| 7,656,023 B2 | 2/2010 | Sunohara et al. |
| 7,659,202 B2 | 2/2010 | Trezza |
| 7,666,711 B2 | 2/2010 | Pagaila et al. |
| 7,678,685 B2 | 3/2010 | Sunohara et al. |
| 7,681,779 B2 | 3/2010 | Yang |
| 7,687,397 B2 | 3/2010 | Trezza |
| 7,691,747 B2 | 4/2010 | Lin et al. |
| 7,701,039 B2 | 4/2010 | Kirby et al. |
| 7,733,661 B2 | 6/2010 | Kossives et al. |
| 7,741,148 B1 | 6/2010 | Marimuthu et al. |
| 7,741,152 B2 | 6/2010 | Huang et al. |
| 7,741,156 B2 | 6/2010 | Pagaila et al. |
| 7,772,081 B2 | 8/2010 | Lin et al. |
| 7,772,116 B2 | 8/2010 | Akram et al. |
| 7,772,118 B2 | 8/2010 | Yamano |
| 7,786,008 B2 | 8/2010 | Do et al. |
| 7,786,592 B2 | 8/2010 | Trezza |
| 7,795,140 B2 | 9/2010 | Taguchi et al. |
| 7,808,060 B2 | 10/2010 | Hsiao |
| 7,808,111 B2 | 10/2010 | Trezza |
| 7,811,858 B2 | 10/2010 | Wang et al. |
| 7,816,265 B2 | 10/2010 | Wang |
| 7,842,597 B2 | 11/2010 | Tsai |
| 8,017,515 B2 * | 9/2011 | Marimuthu et al. .......... 438/612 |
| 8,097,491 B1 * | 1/2012 | Hsu et al. ............... 438/106 |
| 2002/0017855 A1 | 2/2002 | Cooper et al. |
| 2002/0094605 A1 | 7/2002 | Pai et al. |
| 2004/0124518 A1 | 7/2004 | Karnezos |
| 2004/0259292 A1 | 12/2004 | Beyne et al. |
| 2005/0189635 A1 | 9/2005 | Humpston et al. |
| 2005/0258545 A1 | 11/2005 | Kwon |
| 2006/0027632 A1 | 2/2006 | Akram |
| 2006/0057772 A1 * | 3/2006 | Huang ................ 438/106 |
| 2006/0197216 A1 | 9/2006 | Yee |
| 2007/0048896 A1 | 3/2007 | Andry et al. |
| 2007/0138562 A1 | 6/2007 | Trezza |
| 2007/0187711 A1 | 8/2007 | Hsiao et al. |
| 2008/0272486 A1 | 11/2008 | Wang et al. |
| 2009/0032928 A1 | 2/2009 | Chiang et al. |
| 2009/0039527 A1 | 2/2009 | Chan et al. |
| 2009/0140436 A1 | 6/2009 | Wang |
| 2009/0146297 A1 | 6/2009 | Badakere et al. |
| 2009/0166785 A1 | 7/2009 | Camacho et al. |
| 2009/0243045 A1 | 10/2009 | Pagaila et al. |
| 2009/0294959 A1 | 12/2009 | Chiang et al. |
| 2009/0302435 A1 | 12/2009 | Pagaila et al. |
| 2009/0302437 A1 | 12/2009 | Kim et al. |
| 2009/0309235 A1 | 12/2009 | Suthiwongsunthorn et al. |
| 2009/0321916 A1 | 12/2009 | Wang et al. |
| 2010/0059855 A1 | 3/2010 | Lin et al. |
| 2010/0065948 A1 | 3/2010 | Bae et al. |
| 2010/0133704 A1 | 6/2010 | Marimuthu et al. |
| 2010/0140737 A1 | 6/2010 | Lin et al. |
| 2010/0140751 A1 | 6/2010 | Tay et al. |
| 2010/0140752 A1 | 6/2010 | Marimuthu et al. |
| 2010/0140776 A1 | 6/2010 | Trezza |
| 2010/0148316 A1 | 6/2010 | Kim et al. |
| 2010/0187681 A1 | 7/2010 | Chen et al. |
| 2010/0197134 A1 | 8/2010 | Trezza |
| 2010/0213560 A1 | 8/2010 | Wang et al. |
| 2010/0230759 A1 | 9/2010 | Yang et al. |
| 2010/0230760 A1 | 9/2010 | Hung |
| 2010/0230788 A1 | 9/2010 | Peng |
| 2010/0244173 A1 | 9/2010 | Wang et al. |
| 2010/0244244 A1 | 9/2010 | Yang |
| 2010/0244247 A1 | 9/2010 | Chang et al. |
| 2010/0261318 A1 | 10/2010 | Feng et al. |
| 2010/0276690 A1 | 11/2010 | Chen |
| 2010/0327465 A1 | 12/2010 | Shen et al. |
| 2011/0034021 A1 | 2/2011 | Feng et al. |
| 2011/0048788 A1 | 3/2011 | Wang et al. |
| 2011/0068437 A1 | 3/2011 | Chiu et al. |

* cited by examiner

US 8,963,316 B2

SEMICONDUCTOR DEVICE AND METHOD FOR MANUFACTURING THE SAME

BACKGROUND OF THE INVENTION

1. Field of the Invention

The present invention relates to the field of semiconductor packaging, and more particularly, to 3-D semiconductor packaging.

2. Description of the Related Art

In the initial step of the conventional method for making a semiconductor package, the substrate provided by the wafer foundry may have various undesirable characteristics. For example, the size of the pad may be too small or there may have too many different circuits, metal layers, and dielectric layers existing and hindering the formation of conductive vias in the substrate. In particular, it may be difficult to apply a via-last process to etch through the substrate from a backside surface of the wafer to reach the original pad.

SUMMARY OF THE INVENTION

One aspect of the disclosure relates to a semiconductor device. In one embodiment, the semiconductor device includes a substrate, having a pad; a first redistribution layer, disposed adjacent to a first surface of the substrate, and electrically connected to the pad; and a conductive via formed in the substrate. The conductive via includes an annular seed layer disposed on the substrate, and an interconnect layer having an outer surface disposed on an inner surface of the seed layer, the interconnect layer electrically connected to the first redistribution layer. The substrate includes a dielectric layer disposed on the first surface of the substrate, the dielectric layer having a first opening exposing the pad and a second opening corresponding to that of the conductive via. The conductive via extends into the second opening of the dielectric layer. In an embodiment, a portion of the first redistribution layer extends into the second opening of the dielectric layer. The semiconductor device further includes a second redistribution layer, disposed adjacent to a second surface of the substrate and electrically connected to the conductive via. Additionally, the semiconductor device comprises an under bump metallurgy (UBM), disposed on the second redistribution layer; and a solder ball, disposed on the under bump metallurgy (UBM).

Another aspect of the disclosure relates to manufacturing methods. In one embodiment, a manufacturing method includes a method for making a semiconductor device, comprising providing a substrate, having a pad; forming a first redistribution layer adjacent to a first surface of the substrate, wherein the first redistribution layer is electrically connected to the pad; adhering the substrate to a carrier; and forming a conductive via in the substrate, the conductive via electrically connected to the first redistribution layer. The substrate has a dielectric layer disposed on the first surface thereof, and the first dielectric layer has a first opening to expose the pad. The method further comprises forming a second redistribution layer adjacent to a second surface of the substrate, wherein the second redistribution layer is electrically connected to the conductive via.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION OF THE INVENTION

Figure 1:
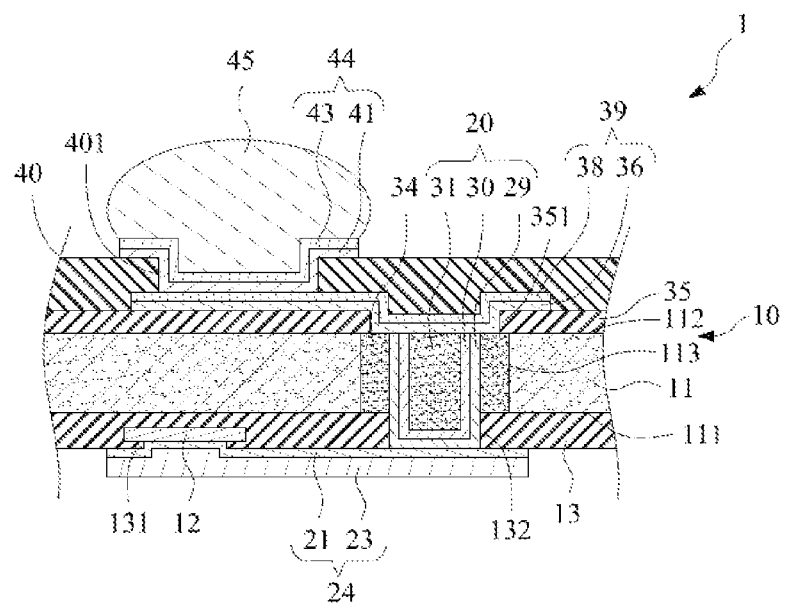
FIG. 1 illustrates a cross-sectional view of a semiconductor device according to an embodiment of the present invention.

Referring to FIG. 1, a cross-sectional view of a semiconductor device 1 according to an embodiment of the present invention is illustrated. The semiconductor device 1 comprises a substrate 10, a first redistribution layer 24, a second redistribution layer 39, a protection layer 40, an under bump metallurgy (UBM) 44 and a solder ball 45.

As shown in FIG. 1, the substrate 10 has a substrate body 11 including a conductive via 20 formed therein, a pad 12, and a first dielectric layer 13. In this embodiment, the material of the substrate body 11 is silicon. However, in other embodiments, the material of the substrate body 11 may be glass. The substrate body 11 has a first surface 111, a second surface 112 and a through hole 113. The pad 12 is disposed adjacent to the first surface 111 of the substrate body 10. In this embodiment, the first dielectric layer 13 is disposed on the first surface 111 of the substrate body 11, and has a first opening 131 and a second opening 132. The first dielectric layer 13 covers the pad 12 except where the first opening 131 exposes a part of the pad 12. The position of the second opening 132 corresponds to that of the conductive via 20. The material of the first dielectric layer 13 can be polyimide (PI) or polypropylene (PP).

In FIG. 1, the first redistribution layer 24 is disposed adjacent to the first surface 111 of the substrate body 11, and electrically connected to the pad 12. In this embodiment, the first redistribution layer 24 comprises a first seed layer 21 and a first metal layer 23. The material of the first seed layer 21 is tantalum nitride or tantalum tungsten, and the material of the first metal layer 23 is copper. However, the first seed layer 21 may be omitted; that is, the first metal layer 23 would be disposed directly on the first redistribution layer 24. The first redistribution layer 24 is disposed on the first dielectric layer 13, and contacts the pad 12 in the first opening 131 of the first dielectric layer 13.

In FIG. 1, the conductive via 20 is disposed in the through hole 113 of the substrate body 11, and contacts the first redistribution layer 24. In this embodiment, the conductive via 20 further extends to the second opening 132 of the first dielectric layer 13. The conductive via 20 has a central insulation material 31 and an interconnection metal 30. In this embodiment, the interconnection metal 30 is in a shape of cup and defines a central groove, and the central insulation material 31 is disposed in the central groove. It is to be understood that the interconnection metal 30 may be a solid pillar (and therefore the central insulation material 31 would be omitted). Preferably, the conductive via 20 further has an interconnection seed layer 29 surrounding the interconnection metal 30, and the bottom of the interconnection seed layer 29 contacts the first redistribution layer 24. In this embodiment, the substrate 10 further has an outer insulation material 34 disposed in the through hole 113 and surrounding the interconnection metal 30 and the interconnection seed layer 29. As shown in FIG. 1, the outer insulation material 34 does not extend to the second opening 132 of the first dielectric layer 13; therefore, the bottom surface of the conductive via 20 is not coplanar with the bottom surface of the outer insulation material 34, and the length of the conductive via 20 is greater than that of the outer insulation material 34. In this embodiment, the material of the central insulation material 31 is polymer, which is the same as the outer insulation material 34.

In FIG. 1, the semiconductor device 1 further comprises a second dielectric layer 35. The second dielectric layer 35 is disposed on the second surface 112 of the substrate body 11, and has an opening 351 to expose the conductive via 20 and the outer insulation material 34. The material of the second dielectric layer 35 can be polyimide (PI) or polypropylene (PP). The second redistribution layer 39 is disposed adjacent to the second surface 112 of the substrate body 11, and electrically connected to the conductive via 20. In this embodiment, the second redistribution layer 39 comprises a second metal layer 38 and a second seed layer 36. The material of the second seed layer 21 is tantalum nitride or tantalum tungsten, and the material of the second metal layer 38 is copper. However, the second seed layer 36 may be omitted; that is, the second metal layer 38 would be disposed on the second redistribution layer 39. The second redistribution layer 39 is disposed on the second dielectric layer 35, and contacts the conductive via 20 in the opening 351 of the second dielectric layer 35.

In FIG. 1, the protection layer 40 covers the second redistribution layer 39 and the second dielectric layer 35, and has an opening 401 to expose a part of the second redistribution layer 39. The material of the protection layer 40 may be the same as that of the second dielectric layer 35. The under bump metallurgy (UBM) 44 is disposed in the opening 401 of the protection layer 40 and on the second redistribution layer 39 so as to electrically connect the second redistribution layer 39. In this embodiment, the under bump metallurgy (UBM) 44 further extends to the top surface of the protection layer 40. The under bump metallurgy (UBM) 44 comprises a third metal layer 43 and a third seed layer 41. The third metal layer 43 is a single layer or multi layer structure, and the material of the third seed layer 41 is tantalum nitride. However, the third seed layer 41 may be omitted; that is, the third metal layer 43 would contact the second redistribution layer 39. The solder ball 45 is disposed on the under bump metallurgy (UBM) 44.

Referring to FIGS. 2 to 16, a method for making the semiconductor device 1 according to an embodiment of the present invention is illustrated.

Figure 2:
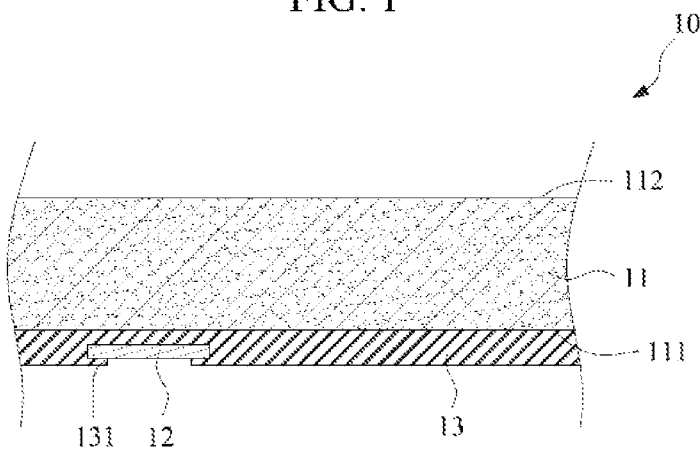
FIGS. 2 to 16 illustrate a method for making the semiconductor device of FIG. 1 according to an embodiment of the present invention.

Referring to FIG. 2, a substrate 10 is provided. The substrate 10 has a substrate body 11, a first dielectric layer 13 and a pad 12. In this embodiment, the material of the substrate body 11 is silicon. However, in other embodiments, the material of the substrate body 11 may be glass. The substrate body 11 has a first surface 111 and a second surface 112, and the pad 12 is disposed adjacent to the first surface 111 of the substrate body 10. In this embodiment, the first dielectric layer 13 is disposed on the first surface 111 of the substrate body 11, and has a first opening 131. The first dielectric layer 13 covers the pad 12 except where the first opening 131 exposes a part of the pad 12. The material of the first dielectric layer 13 can be polyimide (PI) or polypropylene (PP). It is to be noted that if only the substrate body 11 is provided at this initial step, then the method further comprises the steps of forming the first dielectric layer 13 and the pad 12.

Figure 3:
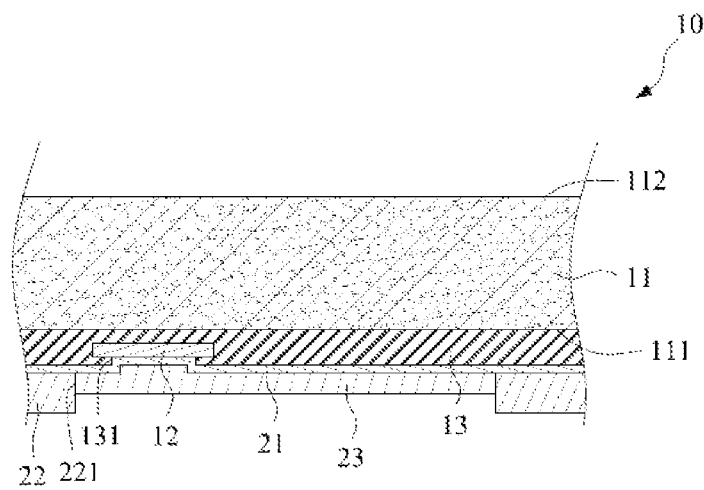

Referring to FIG. 3, a first seed layer 21 is formed on the first dielectric layer 13 and its first opening 131. The first seed layer 21 contacts the pad 12 in the first opening 131. Then, a photoresist layer 22 is formed on the first seed layer 21, and has an opening 221 to expose a part of the first seed layer 13. Then, a first metal layer 23 is formed in the opening 221 of the photoresist layer 22. The material of the first metal layer 23 is copper, and the material of the first seed layer 21 is tantalum nitride or tantalum tungsten.

Figure 4:
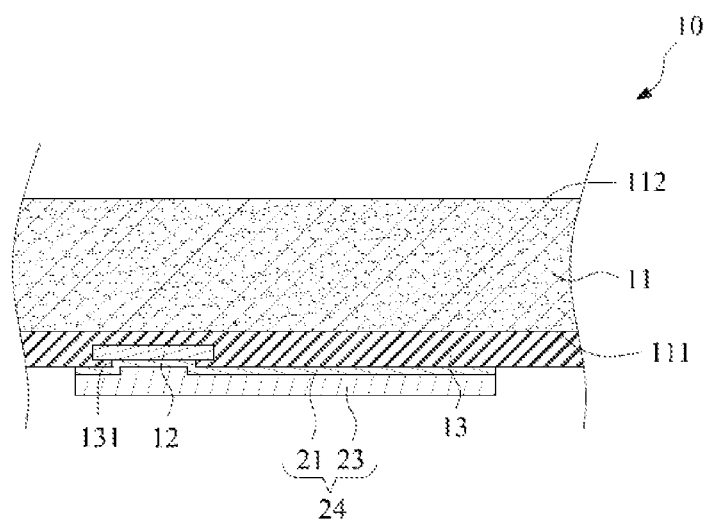

Referring to FIG. 4, the photoresist layer 22 is removed. Then, the portion of the first seed layer 21 that is not covered by the first metal layer 23 is removed so as to form the first redistribution layer 24. The first redistribution layer 24 is disposed adjacent to the first surface 111 of the substrate body 11, and electrically connected to the pad 12. In this embodiment, the first redistribution layer 24 is disposed on the first dielectric layer 13, and contacts the pad 12 in the first opening 131 of the first dielectric layer 13.

Figure 5:
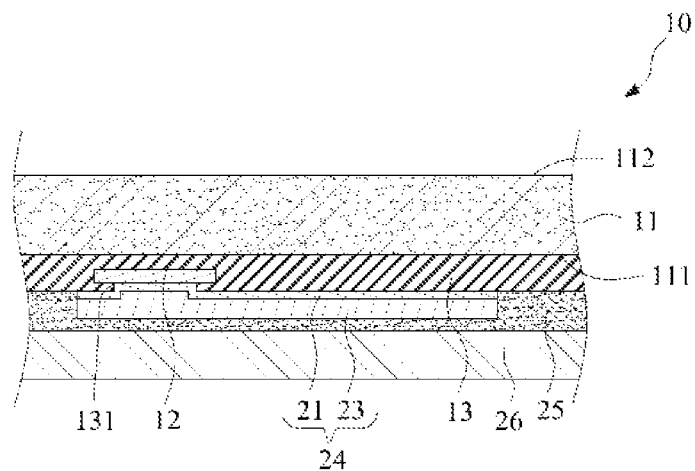

Referring to FIG. 5, the substrate 10 is adhered to a carrier 26 by using an adhesive layer 25, wherein the first surface 111 of the substrate body 11 faces the carrier 26. Then, the substrate body 11 is thinned from its second surface 112.

Figure 6:
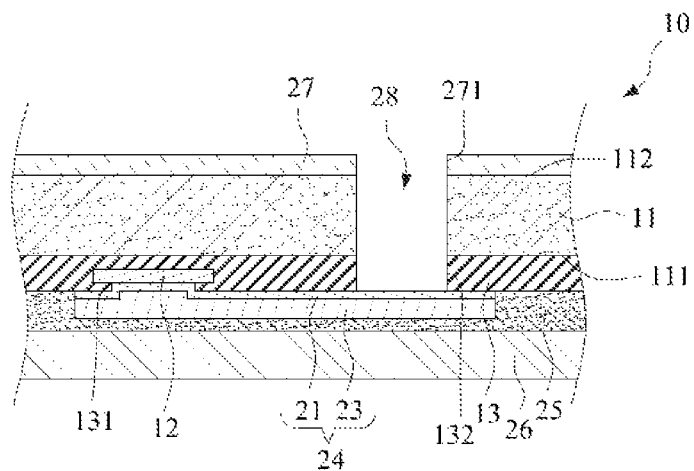

Referring to FIG. 6, a photoresist layer 27 is formed on the second surface 112 of the substrate body 11, and has an opening 271 to expose a part of the second surface 112. Then, a hole 28 is formed from the second surface 112 of the substrate body 11 according to the opening 271 of the photoresist layer 27. The hole 28 penetrates through the substrate body 11 and the first dielectric layer 13, so that the first dielectric layer 13 has a second opening 132. That is, the second opening 132 is a part of the hole 28, and penetrates through the first dielectric layer 13. Therefore, a part of the first redistribution layer 24 is exposed by the hole 28. Notably, the position of the hole 28 does not correspond to that of the pad 12.

Figure 7:
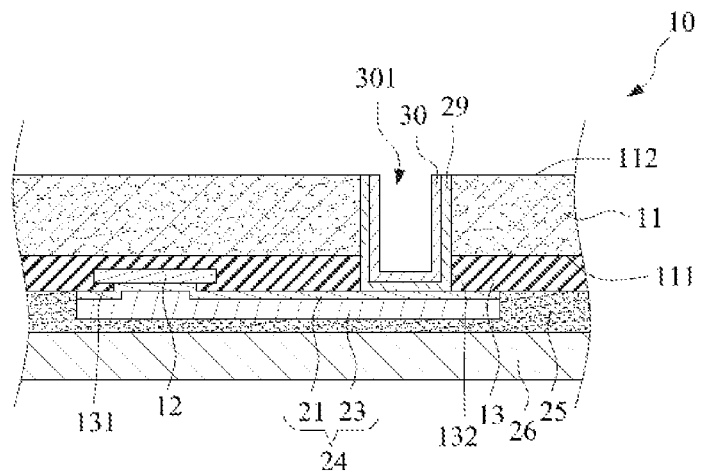

Referring to FIG. 7, an interconnection seed layer 29 is formed in the hole 28 and contacts the first redistribution layer 24. Then, an interconnection metal 30 is formed on the interconnection seed layer 29. In this embodiment, the interconnection metal 30 is in a shape of a cup and defines a central groove 301.

Figure 8:
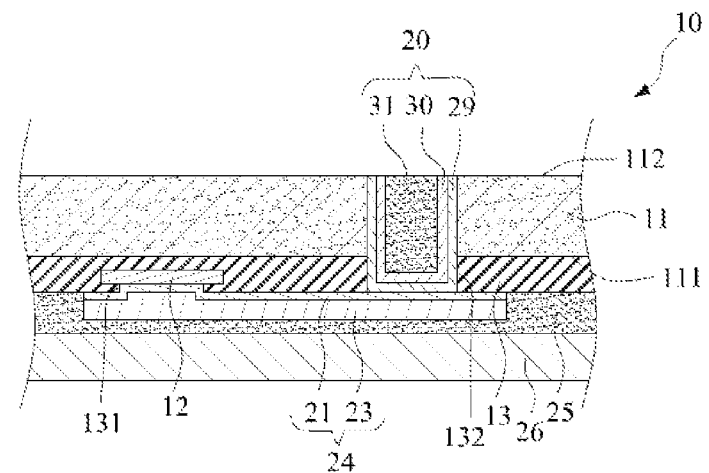

Referring to FIG. 8, a central insulation material 31 is filled in the central groove 301. Thus, a conductive via 20 is formed in the hole 28, and further extends to the second opening 132 of the first dielectric layer 13 to contact the first redistribution layer 24. In other embodiments, the interconnection metal 30 may be a solid pillar, and the central insulation material 31 would be omitted.

Figure 9:
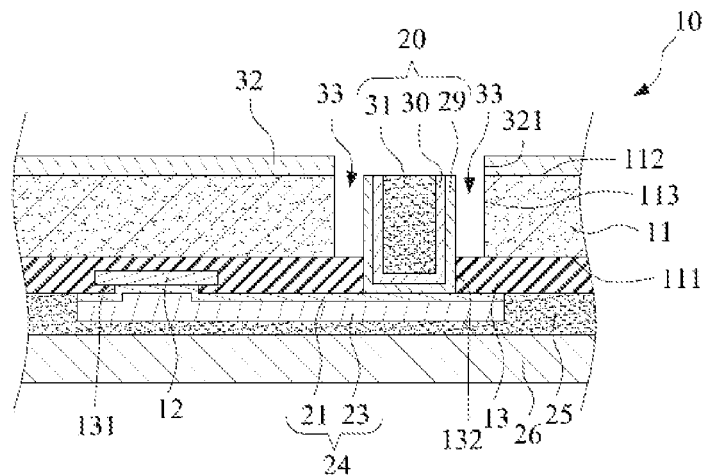

Referring to FIG. 9, a photoresist layer 32 is formed on the second surface 112 of the substrate body 11, and has an opening 321 to expose the conductive via 20. Then, a circular groove 33 is formed from the second surface 112 of the substrate body 11 according to the opening 321, wherein the circular groove 33 surrounds the conductive via 20. In this embodiment, the circular groove 33 only penetrates through the substrate body 11 to form the through hole 113.

Figure 10:
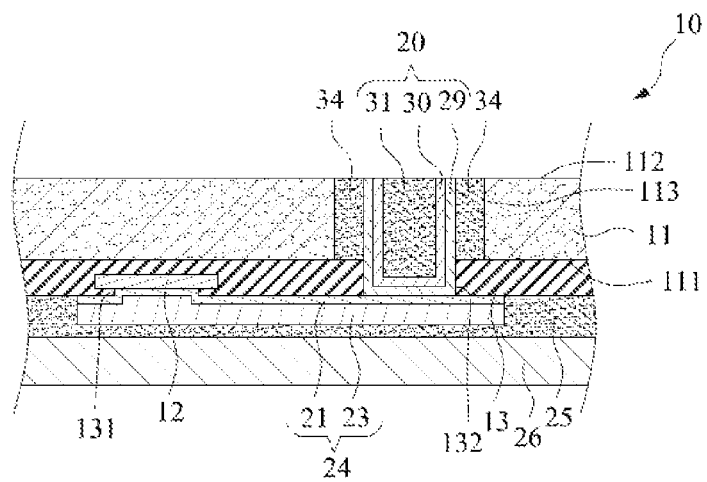

Referring to FIG. 10, an insulation circular layer 34 is formed in the circular groove 33 to surround the interconnection metal 30 and the interconnection seed layer 29. Preferably, the material of the central insulation material 31 is polymer, which is the same as the outer insulation material 34. In this embodiment, the outer insulation material 34 does not extend into the first dielectric layer 13; therefore, the bottom surface of the conductive via 20 is not coplanar with the bottom surface of the outer insulation material 34.

Figure 11:
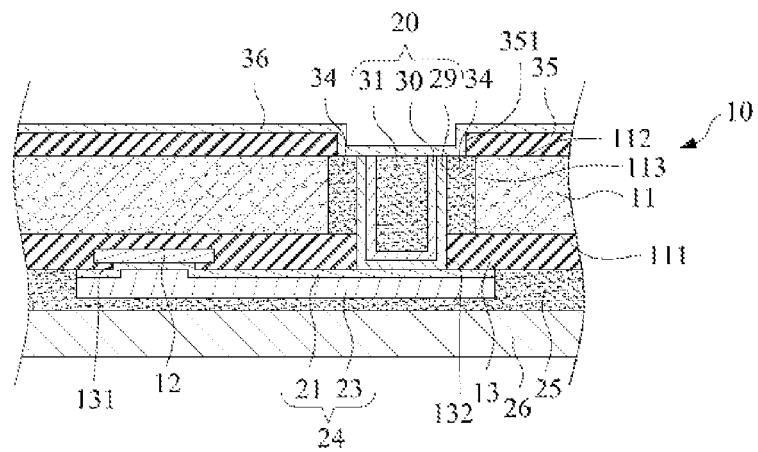

Referring to FIG. 11, a second dielectric layer 35 is formed on the second surface 112 of the substrate body 11, and has an opening 351 to expose the conductive via 20 and the outer insulation material 34. The material of the second dielectric layer 35 can be polyimide (PI) or polypropylene (PP). Then, a second seed layer 36 is formed on the second dielectric layer 35 and its opening 351. The second seed layer 36 contacts the conductive via 20 in the opening 351.

Figure 12:
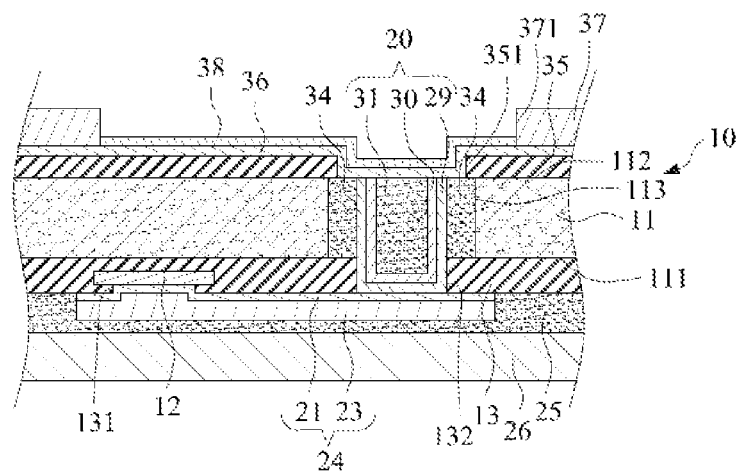

Referring to FIG. 12, a photoresist layer 37 is formed on the second seed layer 36, and has an opening 371 to expose a part of the second seed layer 36. Then, a second metal layer 38 is formed in the opening 371 of the photoresist layer 37. The material of the second metal layer 38 is copper, and the material of the second seed layer 36 is tantalum nitride or tantalum tungsten.

Figure 13:
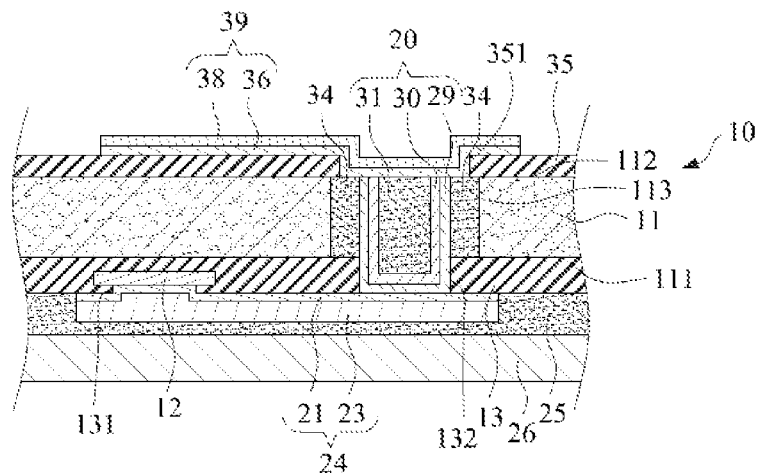

Referring to FIG. 13, the photoresist layer 37 is removed. Then, the portion of the second seed layer 36 that is not covered by the second metal layer 38 is removed so as to form a second redistribution layer 39. In this embodiment, the second redistribution layer 39 is disposed on the second dielectric layer 35, and contacts the conductive via 20 in the opening 351 of the second dielectric layer 35.

Figure 14:
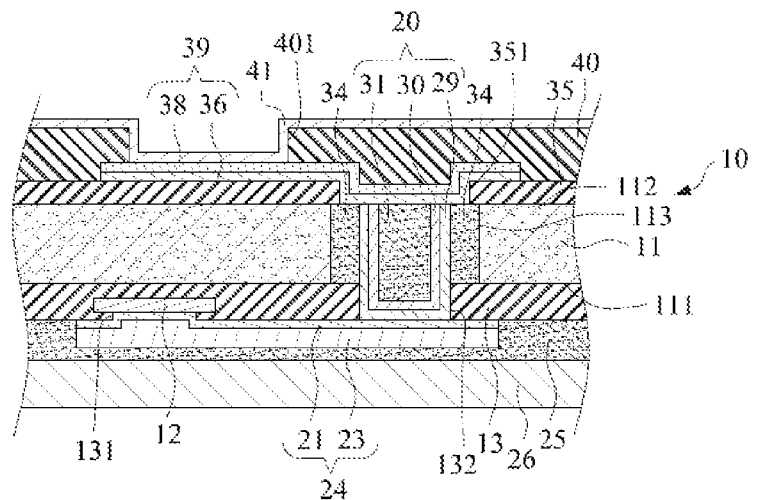

Referring to FIG. 14, a protection layer 40 is formed on the second dielectric layer 35 and the second redistribution layer 39, and has an opening 401 to expose a part of the second redistribution layer 39. The material of the protection layer 40 may be the same as that of the second dielectric layer 35. Then, a third seed layer 41 is formed on the protection layer 40 and its opening 401. The material of the third seed layer 41 is tantalum nitride or tantalum tungsten.

Figure 15:
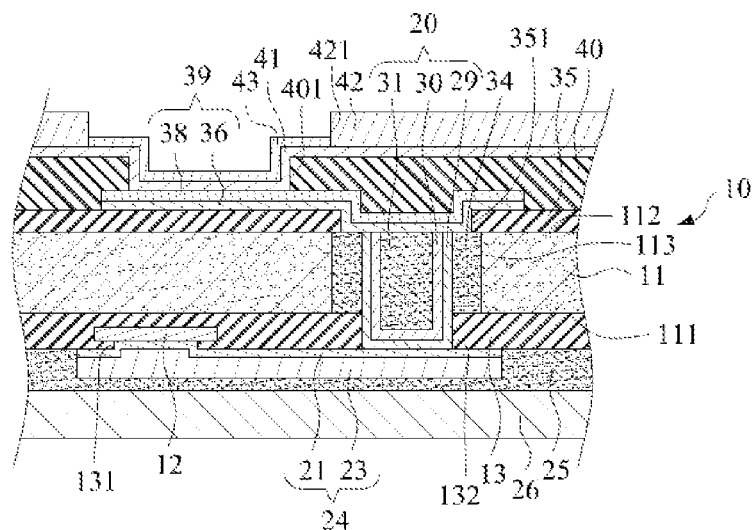

Referring to FIG. 15, a photoresist layer 42 is formed on the third seed layer 41, and has an opening 421 to expose a part of the third seed layer 41. Then, a third metal layer 43 is formed in the opening 421 of the photoresist layer 42. The third metal layer 43 is a single layer or multi layer structure.

Figure 16:
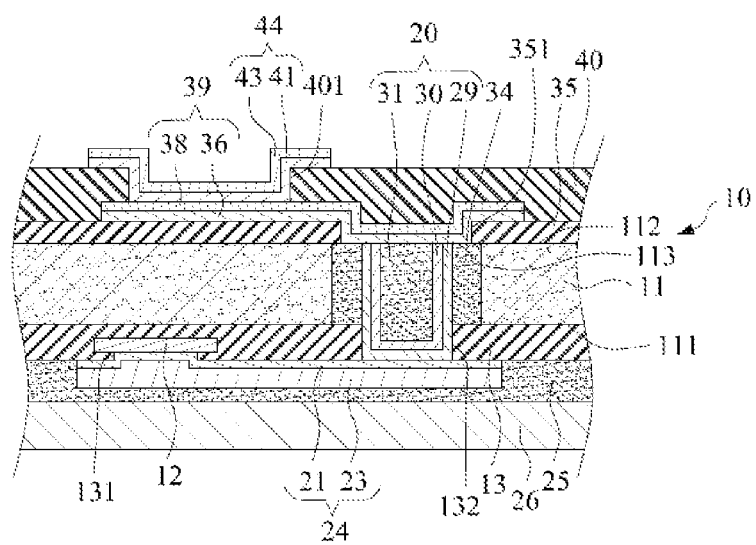

Referring to FIG. 16, the photoresist layer 42 is removed. Then, the portion of the third seed layer 41 that is not covered by the third metal layer 43 is removed so as to form an under bump metallurgy (UBM) 44. Then, a solder ball 45 is formed on the under bump metallurgy (UBM) 44, and the carrier 26 and the adhesive layer 25 are removed, so as to obtain the semiconductor device 1.

In this embodiment, if the substrate 10 provided by the wafer foundry has an undesirable circuitry, for example, the size of the pad 12 is too small, the pad 12 has to too many layers, or the pad 12 is disposed at an undesirable position, the pad 12 still can be electrically connected to the second surface 112 of the substrate body 11 through the first redistribution layer 24 and the conductive via 20.

Figure 17:
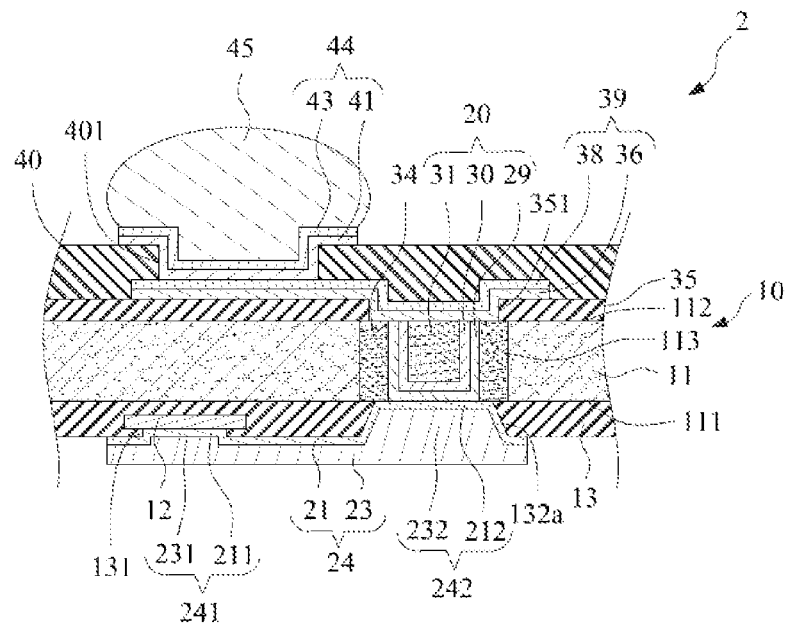
FIG. 17 illustrates a cross-sectional view of a semiconductor device according to another embodiment of the present invention.

Referring to FIG. 17, a cross-sectional view of a semiconductor device 2 according to an embodiment of the present invention is illustrated. The semiconductor device 2 of this embodiment is substantially the same as the semiconductor device 1 of FIG. 1, and the same elements are designated with same reference numerals. The difference between the semiconductor device 2 of this embodiment and the semiconductor device 1 of FIG. 1 is that the structure within the second opening 132a of the first dielectric layer 13 is different. In this embodiment, the first redistribution layer 24 has a first portion 241 and a second portion 242. The first portion 241 of the first redistribution layer 24 is disposed in the first opening 131 of the first dielectric layer 13, and includes a first portion 231 of the first metal layer 23 and a first portion 211 of the first seed layer 21. The second portion 242 of the first redistribution layer 24 is disposed in the second opening 132a of the first dielectric layer 13, and includes a second portion 232 of the first metal layer 23 and a second portion 212 of the first seed layer 21. The first portion 241 of the first redistribution layer 24 contacts the pad 12, and the conductive via 20 contacts the second portion 242 of the first redistribution layer 24.

In FIG. 17, the conductive via 20 does not extend into the first dielectric layer 13. Therefore, the bottom surface of the conductive via 20 is substantially coplanar with the bottom surface of the outer insulation material 34, and the length of the conductive via 20 is equal to that of the outer insulation material 34. Preferably, the size of the second opening 132a of the first dielectric layer 13 is slight larger than that of the conductive via 20, which results in that the size of the second portion 242 of the first redistribution layer 24 is slight larger than that of the conductive via 20, and the electrical connection therebetween is ensured.

Figure 18:
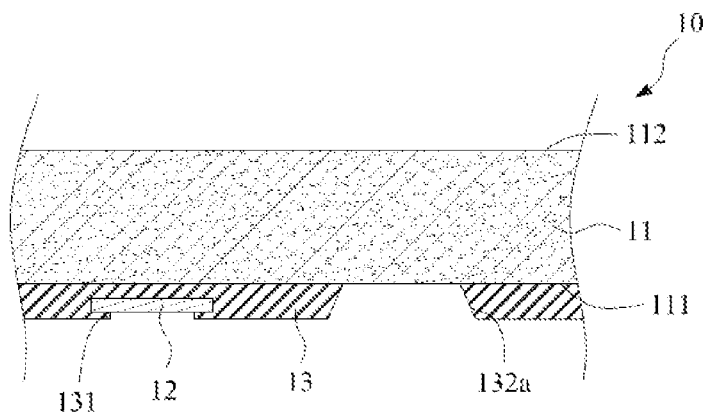
FIGS. 18 to 20 illustrate a method for making the semiconductor device of FIG. 17 according to an embodiment of the present invention.
Figure 19:
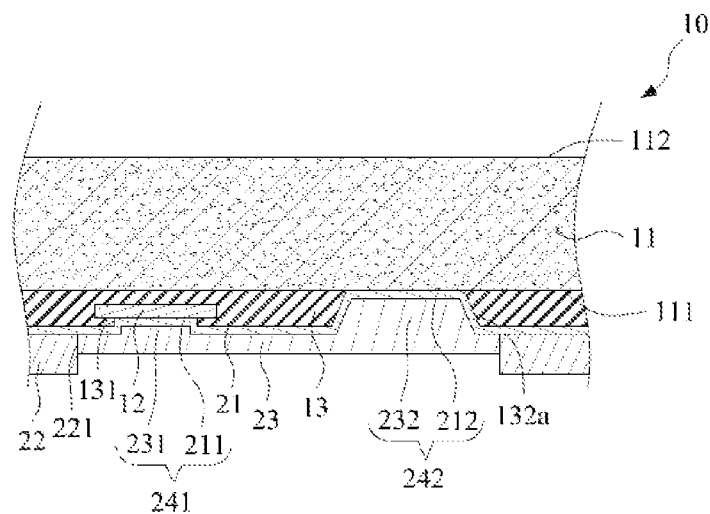
Figure 20:
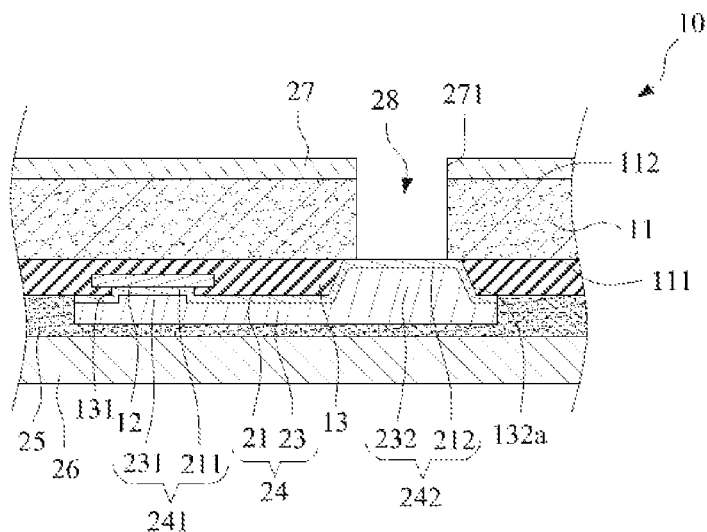

Referring to FIGS. 18 to 20, a method for making the semiconductor device 2 according to an embodiment of the present invention is illustrated. The method of this embodiment is substantially the same as the method of FIGS. 2 to 16, the difference is described below.

Referring to FIG. 18, a substrate 10 is provided. The substrate 10 has a substrate body 11, a first dielectric layer 13 and a pad 12. In this embodiment, the material of the substrate body 11 is silicon. However, in other embodiments, the material of the substrate body 11 may be glass. The substrate body 11 has a first surface 111 and a second surface 112. The first dielectric layer 13 is disposed on the first surface 111 of the substrate body 11, and has a first opening 131 and a second opening 132a. The first dielectric layer 13 covers the pad 12, and the first opening 131 exposes a part of the pad 12. The second opening 132a exposes a part of the first surface 111 of the substrate body 11. It is to be noted that if the substrate 10 provided at this initial step does not include the second opening 132a, then the method further comprises a step of forming the second opening 132a.

Referring to FIG. 19, a first seed layer 21 is formed on the first dielectric layer 13 and its first opening 131 and second opening 132a. The first seed layer 21 has a first portion 211 in the first opening 131 and a second portion 212 in the second opening 132a. The first portion 211 of the first seed layer 21 contacts the pad 12, and the second portion 212 of the first seed layer 21 contacts the substrate body 11. Then, a photoresist layer 22 is formed on the first seed layer 21, and has an opening 221 to expose a part of the first seed layer 13. Then, a first metal layer 23 is formed in the opening 221 of the photoresist layer 22. The material of the first metal layer 23 is copper, and the material of the first seed layer 21 is tantalum nitride or tantalum tungsten. The first metal layer 23 has a first portion 231 in the first opening 131 and a second portion 232 in the second opening 132a.

Referring to FIG. 20, the photoresist layer 22 is removed. Then, the portion of the first seed layer 21 that is not covered by the first metal layer 23 is removed so as to form the first redistribution layer 24. The first redistribution layer 24 has the first portion 241 and the second portion 242. The first portion 241 of the first redistribution layer 24 is disposed in the first opening 131 of the first dielectric layer 13, and includes a first portion 231 of the first metal layer 23 and a first portion 211 of the first seed layer 21. The second portion 242 of the first redistribution layer 24 is disposed in the second opening 132a of the first dielectric layer 13, and includes a second portion 232 of the first metal layer 23 and a second portion 212 of the first seed layer 21. The first portion 241 of the first redistribution layer 24 contacts the pad 12.

In FIG. 20, the substrate 10 is adhered to a carrier 26 by using an adhesive layer 25. Then, the substrate body 11 is thinned from its second surface 112. Then, a hole 28 is formed from the second surface 112 of the substrate body 11 according to an opening 271 of a photoresist layer 27. In this embodiment, the hole 28 only penetrates through the substrate body 11 to expose the second portion 242 of the first redistribution layer 24.

Referring to FIG. 17, the conductive via 20 is formed in the hole 28 to contact the second portion 242 of the first redistribution layer 24. Then, an insulation circular layer 34, a second dielectric layer 35, a second redistribution layer 39, a protection layer 40, an under bump metallurgy (UBM) 44 and a solder ball 45 are formed on the second surface 112 of the substrate body 11, as shown in FIGS. 9 to 16, and the semiconductor device 2 is obtained.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not be necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor device, comprising:
a substrate, having a pad;
a first redistribution layer, disposed adjacent to a first surface of the substrate, and electrically connected to the pad;
a conductive via formed in the substrate, the conductive via including an annular seed layer disposed on the substrate, and an interconnect layer having an outer surface disposed on an inner surface of the seed layer, the interconnect layer electrically connected to the first redistribution layer;
wherein the substrate further includes a dielectric layer disposed on the first surface of the substrate, the dielectric layer having a first opening exposing the pad; and
wherein the dielectric layer further includes a second opening corresponding to that of the conductive via.

2. The semiconductor device of claim 1, further comprising a second redistribution layer, disposed adjacent to a second surface of the substrate and electrically connected to the interconnect layer.

3. The semiconductor device of claim 1, wherein the conductive via extends into the second opening of the dielectric layer.

4. The semiconductor device of claim 1, wherein a portion of the first redistribution layer extends into the second opening of the dielectric layer.

5. The semiconductor device of claim 1, further comprising:

a second redistribution layer, disposed adjacent to a second surface of the substrate and electrically connected to the interconnect layer;
an under bump metallurgy (UBM), disposed on the second redistribution layer; and
a solder ball, disposed on the under bump metallurgy (UBM).

6. The semiconductor device of claim 1, further including a second dielectric layer disposed on the second surface of the substrate, the second dielectric layer including an opening to expose the conductive via.

7. A semiconductor device, comprising:
a substrate, having a pad;
a first redistribution layer, disposed adjacent to a first surface of the substrate, and electrically connected to the pad;
a conductive via formed in the substrate, the conductive via including an annular seed layer having an outer surface disposed on the substrate and an annular interconnect layer having an outer surface disposed on an inner surface of the seed layer and an inner surface disposed on an outer surface of an insulation layer, the interconnect layer electrically connected to the first redistribution layer;
a second redistribution layer, disposed adjacent to a second surface of the substrate and electrically connected to the interconnect layer; and
a dielectric layer disposed on the first surface of the substrate, the dielectric layer having a first opening exposing the pad and a second opening corresponding to that of a conductive via formed in the substrate, wherein the first opening and the second opening are positioned at different locations.

8. The semiconductor device of claim 7, wherein the conductive via extends into the second opening of the dielectric layer.

9. The semiconductor device of claim 7, wherein a portion of the first redistribution layer extends into the second opening of the dielectric layer.

10. The semiconductor device of claim 7, further comprising:
an under bump metallurgy (UBM), disposed on the second redistribution layer; and
a solder ball, disposed on the under bump metallurgy (UBM).

11. The semiconductor device of claim 7, further including a second dielectric layer disposed on the second surface of the substrate.

12. The semiconductor device of claim 11, wherein the second dielectric layer includes an opening to expose the conductive via.

13. The semiconductor device of claim 7, wherein the material of the substrate is silicon or glass.

14. A semiconductor device, comprising:
a substrate;
a dielectric layer disposed on a first surface of the substrate;
a pad covered by the dielectric layer except where a first opening of the dielectric layer exposes part of the pad;
a first redistribution layer, disposed adjacent to the first surface of the substrate, and electrically connected to the pad; and
a conductive via formed in the substrate and electrically connected to the first redistribution layer;
wherein the dielectric layer further includes a second opening corresponding to that of the conductive via, the conductive via extending into the second opening.

15. The semiconductor device of claim 14, wherein a portion of the first redistribution layer extends into the first opening of the dielectric layer to electrically connect to the pad.

16. The semiconductor device of claim 14, further comprising a second redistribution layer, disposed adjacent to a second surface of the substrate and electrically connected to the conductive via.

* * * * *